United States Patent
Goessel et al.

(10) Patent No.: US 7,814,384 B2
(45) Date of Patent: Oct. 12, 2010

(54) ELECTRICAL DIAGNOSTIC CIRCUIT AND METHOD FOR THE TESTING AND/OR THE DIAGNOSTIC ANALYSIS OF AN INTEGRATED CIRCUIT

(75) Inventors: Michael Goessel, Mahlow (DE); Andreas Leininger, München (DE)

(73) Assignee: Infineon Technologies AG, Neubiberg (DE)

( * ) Notice: Subject to any disclaimer, the term of this patent is extended or adjusted under 35 U.S.C. 154(b) by 598 days.

(21) Appl. No.: 10/568,842

(22) PCT Filed: Aug. 11, 2004

(86) PCT No.: PCT/DE2004/001799
§ 371 (c)(1),
(2), (4) Date: Jul. 14, 2008

(87) PCT Pub. No.: WO2005/020075
PCT Pub. Date: Mar. 3, 2005

(65) Prior Publication Data
US 2008/0263421 A1    Oct. 23, 2008

(30) Foreign Application Priority Data
Aug. 20, 2003 (DE) .................. 103 38 922

(51) Int. Cl.
G01R 31/28 (2006.01)
G01R 31/26 (2006.01)
G11C 29/00 (2006.01)
G06F 17/50 (2006.01)

(52) U.S. Cl. .............. 714/732; 714/724; 324/765; 365/201; 716/4

(58) Field of Classification Search ................ None
See application file for complete search history.

(56) References Cited

U.S. PATENT DOCUMENTS

| 4,503,537 A | 3/1985 | McAnney |
| 4,601,034 A | 7/1986 | Sridhar |
| 5,081,626 A | 1/1992 | Scott |
| 5,230,000 A | 7/1993 | Mozingo et al. |
| 5,574,733 A | 11/1996 | Kim |
| 5,745,500 A | 4/1998 | Damarla et al. |
| 5,831,992 A | 11/1998 | Wu |
| 5,930,270 A | 7/1999 | Forlenza et al. |

(Continued)

FOREIGN PATENT DOCUMENTS

| DE | 19929546 | 9/2000 |
| WO | 01/38889 | 5/2001 |

OTHER PUBLICATIONS

Laung-Terng Wang, "Autonomous Linear Feedback Shift Register with On-Line Fault-Detection Capability", 1982 IEEE, XP 000746113, pp. 311-314.

(Continued)

Primary Examiner—Kevin L Ellis
Assistant Examiner—Guerrier Merant
(74) Attorney, Agent, or Firm—Dicke, Billig & Czaja, PLLC

(57) ABSTRACT

An electrical diagnostic circuit and testing method is disclosed. In one embodiment, the electrical diagnostic circuit for testing an integrated circuit includes a number of external inputs, a plurality of essentially similar, series-connected switching units and a circuit output. The switching units are constructed to be controllable in such a manner that an input signal present at the internal input of the switching unit, in dependence on a control signal of the switching unit, can either be forwarded unchanged to the internal input of the switching unit in each case arranged downstream, or can be combined with the test signal in each case present at the external input.

40 Claims, 6 Drawing Sheets

U.S. PATENT DOCUMENTS

| | | |
|---|---|---|
| 6,055,660 A | 4/2000 | Meaney |
| 6,158,033 A | 12/2000 | Wagner et al. |
| 6,442,723 B1 | 8/2002 | Koprowski et al. |
| 6,510,398 B1 | 1/2003 | Kundu et al. |
| 7,644,333 B2 * | 1/2010 | Hill et al. .................... 714/732 |

OTHER PUBLICATIONS

IBM Technical Disclosure Bulletin, "Reconfigurable Linear Feedback Shift Register", vol. 34 No. 6 Nov. 1991, XP 000212785, pp. 377-380.

P.H. Bardell, W.H. Mc Anney und J. Savir, "Built-In Test for VLSI: Pseudorandom Techniques", New York, 1987, pp. 285-287.

M. Abromovici, M.A. Breuer, A.D. Friedman; "Digital Systems Testing and Testable Design", Computer Science Press, pp. 365-382.

L. Voelkel, J. Pliquett; "Theore-tische Grundlagen und Probleme—Ausblick und Anwendungen"; Akade-mie-Verlag Berlin 1988 Standard Literature.

Shu Lin, D.J. Costello; "Error Control Coding, Fundamentals and Applications", New Jersey 07632 pp. 79-85.

Gerner, M. Muller, B.: Sandweg, G.: Selbsttest digitaler Schaltungen. Munchen (u.a.): Oldenbourg, 1990, p. 100-117, 140-151.

Internet Page http://www.adobe.com/products/acrobat/readste2.html of Dec. 17, 2001 (reconstructed by http://www.archive.org).

* cited by examiner

ELECTRICAL DIAGNOSTIC CIRCUIT AND METHOD FOR THE TESTING AND/OR THE DIAGNOSTIC ANALYSIS OF AN INTEGRATED CIRCUIT

CROSS-REFERENCE TO RELATED APPLICATION

This Utility Patent Application claims the benefit of the filing date of Application No. DE 103 38 922.9, filed Aug. 20, 2003 and International Application No. PCT/DE2004/001799 filed Aug. 11, 2004, both of which are herein incorporated by reference.

FIELD OF THE INVENTION

The invention relates to an electrical diagnostic circuit and to a method for the testing and/or the diagnostic analysis of an integrated circuit.

BACKGROUND

Due to the high degree of integration of modem sequential circuits, the test and the diagnostic analysis of such circuits requires great effort. In the test of electronic test circuits, test patterns are usually applied to the input contacts of the circuits to be tested and the test responses of the circuits are analyzed.

In this context, it is conceivable to combine or to compact, respectively, the test responses of the circuits to be tested in a multi-input signature register to form a signature. The signature thus obtained is compared with the error-free signature, for example previously obtained by means of a simulation, in the tester used for testing such integrated circuits. When the two signatures match, the integrated circuit is free of errors. If the two signatures differ, the tested circuit is faulty.

If an integrated circuit is identified as faulty during such a test, it is expensive and time-consuming to accurately locate the faulty memory cells or the faulty elements of this integrated circuit. To identify the faulty memory cells or the faulty circuit elements, respectively, often time-consuming and costly 100% tests must therefore be performed by diagnostic analysis following such combinational test methods.

For these and other reasons, there is a need for the present invention.

SUMMARY

The present invention provides an electrical diagnostic circuit and a method for the testing and for the diagnostic analysis of an integrated circuit by means of which data of the circuit to be diagnosed, which are output with errors, can be reliably noticed and rapidly and accurately located.

The invention relates to an electrical diagnostic circuit for the testing and/or the diagnostic analysis of an integrated circuit. In one embodiment, this electrical diagnostic circuit is also called a compactor.

This compactor can be provided on any plane of abstraction or on any test equipment plane, respectively, on all possible circuits or devices. In particular, it is possible to construct this compactor on the actual integrated circuit to be tested and/or to be diagnosed, as a result of which a so-called built-in self test of the integrated circuit becomes possible.

The compactor includes a plurality of external inputs for receiving digital output values of an integrated circuit to be tested or to be diagnosed. In the text which follows, these output values are also called test signals or test data. The external inputs of the compactor can be applied directly to correspondingly digital outputs of scan paths of such an integrated circuit.

Furthermore, the electrical diagnostic circuit according to the invention comprises a plurality of essentially similar switching units arranged in series. Each of these switching units is connected to in each case one external input and can receive test signals from an integrated circuit.

Furthermore, each switching unit in each case comprises an internal input for an input signal from a switching unit arranged upstream and/or for a signal fed back which, in particular, is fed back to this internal input from a downstream switching unit.

The switching units can be activated by a control signal in such a manner that an input signal present at the internal input is forwarded either unchanged to the internal input of the switching unit arranged downstream in each case and/or fed back unchanged to an internal input of a switching unit arranged upstream, or is combined with the test signal in each case present at the external input and the combination value determined from this combination is forwarded to the internal input of the switching unit in each case arranged downstream and/or is fed back to the internal input of a switching unit arranged upstream.

The compactor also has a circuit output for outputting a digital output value.

A number of switching units connected in series according to the invention form a shift register. A shift register, in which output values are fed back both to the start of the shift register and between individual switching units of the shift register can also be called shift registers of the first type. Shift registers in which feedback always takes place to the start of the shift register are also called shift registers of the second type. In this context, it is possible so that it is not only the output values of the shift register but also values located between the individual switching units that are fed back to the start.

According to one embodiment of the invention, the individual switching units can be selectively activated in such a manner that the test signals of the electrical circuit to be tested and/or to be diagnosed, present at the respective external inputs, are processed by the switching units or are optionally blanked out and not taken into consideration. In this arrangement of the compactor according to the invention, it is not provided to replace test signals present at the external inputs by fixed values or by the value 0, respectively. Instead, the test signals present at the external inputs are selectively blanked out.

If the subsequent tester finds at least one errored test signal on at least one external input, the faulty scan cell or faulty memory cell or faulty element of the integrated circuit tested can be determined accurately by a suitable sequence of test runs in which individual test signals are selectively not detected by the compactor.

According to one embodiment of the invention, the test signals output in parallel on the scan paths are considered as information bits of a linear error-correcting code. By selectively blanking out scan paths, the k control bits of an error-correcting code are output in k runs at the output of the compactor without feedback during the diagnostic analysis. As a result, the errored scan cells can be accurately determined. Due to the capability of being able to correct a particular number of errors within a data range by means of the control bits, these errors can also be accurately located.

If, in an advantageous development of the invention, only the signature of the compactor and not its output are considered for each of the k runs, the errored scan paths can be diagnosed. The number of control bits increases logarithmically with the number of scan paths. The number of control bits is optimal in the sense of the coding theory known to the expert.

In a first embodiment of the compactor, each switching unit comprises one gate each, particularly an exclusive OR gate, one multiplexer each and one storage unit each. Each external input leads to one input each of the exclusive OR gate.

Each internal input of the switching unit leads to a first input of the multiplexer and, in parallel, to a second input of the exclusive OR gate. The output of the exclusive OR gate is connected to the second input of the multiplexer. The first input of the multiplexer is here selected as a zero input and the second input of the multiplexer is selected as the one input. The output of the multiplexer is connected to one input of the storage element. The output of the storage element also represents the output of the switching unit.

Such a compactor enables the values which are to be read by the storage elements in the next clock cycle in each case to be internally activated. The provision of multiplexers enables the storage elements to store either the value of the preceding storage element or the value which is obtained from the exclusive OR combination of the value of the storage element arranged upstream and the test signal present at the associated external input in each case. This embodiment of the compactor is a variant which operates particularly reliably and is inexpensive to produce.

The selection of which test signals of which external inputs of the compactor are to be subjected to an exclusive OR combination and for which test signals of which inputs such an OR combination is to be omitted, can be effected in that the internal input of the switching unit is connected, in dependence on the control signal, by the first input of the multiplexer or by the exclusive OR gate and the second input of the multiplexer to the input of the storage element of the switching unit. Such selective combinations and suppressions can be implemented particularly advantageously by means of controllable multiplexers.

According to a further embodiment of the invention, the compactor also comprises a controllable feedback unit which is connected to the circuit output and by means of which the output value can be fed back to at least one internal input of a switching unit. The controllability of the feedback unit ensures that the values present at the circuit output are only fed back when this is wanted. Otherwise, the compactor according to the invention operates like a normal shift register without feedback. Equipping a compactor according to the invention with such a controllable feedback unit extends its functionality.

The feedback unit can be constructed as a controllable gate, particularly as a controllable AND gate and have a control signal input. When a predetermined value, particularly the value one, is present at this control signal input, the output value of the compactor is fed back to one or more internal inputs of the switching units. The compactor according to the invention can thus also be operated in the compacting mode in which the signature of the compactor can be reliably calculated.

According to an advantageous development of the invention, the switching units of the electrical diagnostic circuit can in each case have at least two, particularly series-connected storage units. The output of the last storage unit in each case of each switching unit then also forms the output of the relevant switching unit. Thus, even more storage elements are available for temporarily storing the test signals.

It is also advantageous if one or more storage units, in each case connected in series, are placed directly preceding the compactor output or also between individual switching units.

According to a further embodiment of the invention, the feedback unit also has an exclusive OR gate, the inputs of which are formed by feedback lines which in each case branch off after at least one switching unit. In this arrangement, the output of the exclusive OR gate is connected to one input of the controllable gate. This advantageous embodiment of the compactor according to the invention forms a shift register of the second type. In this arrangement, values from a number of switching units can be combined and fed back to the start of the compactor according to the invention.

If the feedback unit additionally has a further controllable gate, the inputs of which are formed by a further control signal input and by the output of the last switching unit of the compactor, and the output of which forms the compactor output, it is possible to deal correctly with indeterminate values or X values. Such X values frequently occur in the testing of integrated circuits and cannot be predicted. Providing the further controllable gate reliably prevents the state and the signature of the compactor becoming indeterminate on occurrence of such X values, whereby no further reliable statement about the operability of the integrated circuit tested or diagnosed is possible. This is because such indeterminate values are set to a certain value by the further controllable gate, the result being that the state of the compactor and also the output values of the compactor remain predictable.

The further controllable gate can in this case be constructed as controllable AND gate, as controllable OR gate, as controllable NAND gate or as controllable NOR gate. In the case of a controllable AND gate, the value of the control signal must be set to zero and in the case of a controllable OR gate the value must be set to one, in the case of the occurrence of an X value.

In shift registers of the second type, further gates, particularly further exclusive OR gates, can be located between switching units in each case arranged in series. The output value present in each case at the circuit output can be conducted to this further gate or these further gates as a result of which a feedback according to the shift register of the first type can be achieved. Using a compactor of this type of construction, errored scan cells can be determined rapidly and reliably.

According to a variant of the compactor according to the invention, the first switching unit can be constructed differently from the remaining storage units already described and comprise only one AND gate and one storage unit. In this arrangement, the first external input is connected to the first input of the AND gate, a control line is connected to the second input of the AND gate and the output of the AND gate is connected to the storage unit. The output of the storage unit forms the output of the first switching unit. In this variant, the remaining switching units of the compactor are present in one of the embodiments already described. Using a compactor according to the invention constructed in this manner, integrated circuits can be reliably tested.

In a further embodiment of the invention, the output of the last switching unit is connected to a shift register with linear feedback. The shift register with linear feedback contains an exclusive OR gate, a number of series-connected storage elements and at least one feedback line branching off after a storage element, which leads/lead to in each case one input of the exclusive OR gate. The first storage element is connected to the output of the exclusive OR gate. Using a compactor having such a shift register, integrated circuits can also be reliably tested.

According to an advantageous development, the compactor has a selection circuit at its inputs for its control.

The invention also relates to an integrated circuit to be tested and/or to be diagnosed on which a compactor in one of the embodiments described above is contained, particularly in addition to the normal circuit, virtually as an add-on. In this arrangement, the compactor is monolithically integrated on the integrated circuit or on the semiconductor component.

The invention also relates to a probe card for testing integrated circuits in which a compactor is integrated in one of the embodiments described above.

The invention also relates to a tester-related load board with test sockets for inserting integrated circuits or for receiving such a probe card or for connecting a handler, at least one compactor being integrated on the load board in one of the embodiments described above. Such a load board can also be called an adapter board.

The invention also relates to a measuring device or a tester, respectively, with measuring sensors, for example for currents and for voltages and with instruments for generating digital signals or datastreams. In this arrangement, at least one compactor in one of the embodiments described above is contained in the measuring device.

According to a further basic concept of the invention, the compactor according to the invention in all the embodiments described above can be provided simply and in a very space-saving manner on all possible circuits or devices on any plane of abstraction or on any measuring device plane, respectively. This will not impair its operation. The actual embodiment of the subject matters described above with such a compactor can be carried out by the expert completely and unambiguously from the information contained in this patent specification and from his technical knowledge. It is only necessary to observe that the compactor must be mounted additionally to the circuit contained on the subject matters mentioned above in each case.

The invention also relates to a method for testing and/or for diagnosing an integrated circuit.

A compactor is first provided which has n external inputs for receiving test data of n parallel datastreams of an integrated circuit to be tested and/or to be diagnosed and which is capable of generating signatures from the received test data. The test data present at the n external inputs are included or not included selectively in the generation of the signatures via switching units.

Accordingly, the compactor is connected to the integrated circuit to be tested and/or to be diagnosed in such a manner that the n inputs of the compactor are present at the n outputs of the scan paths of the integrated circuit.

Following this, a control signal is applied to the switching units so that the input signals present at the internal inputs of the switching units are combined with the test signals present in each case at the external inputs and that the combination values determined in each case from these combinations are forwarded to the internal inputs of the switching units in each case arranged downstream.

The test signals of the datastreams are then processed by the compactor in one or more test runs to form a signature. During this process, a number of successive test runs are performed, a new signature being generated in each test run. The test data of the integrated circuit to be tested and/or to be diagnosed are processed to form a one-bit-wide datastream at the output of the compactor, which is also called the output signature.

The tester then checks the data words for correctness by comparing the signatures determined by the compactor with the correct signatures stored in the tester or generated by the tester, for example by simulation. In this process, the one-bit-wide datastream stored in the tester or determined in a tester is compared with the one-bit-wide datastream in each case present at the output of the compactor.

If the tester finds one or more errored signatures, the following diagnostic steps are performed. The time at which the performance of these diagnostic steps is begun is selected differently. Carrying out the diagnostic steps can be begun immediately after a single errored signature is found, after a predetermined number of errored signatures is found or only after all test runs have ended.

In the diagnostic mode, k successive test runs are performed. In each case, only those data, present at the input $E_i$ of the n datastreams in the jth run are included in the compacting in the electrical diagnostic circuit if the binary coefficient $a_{i,j}$ of the equations for determining the control points of a linear separable error-correcting code with n information points $u_1, \ldots, u_n$ and with k control points $v_1, \ldots, v_k$ is equal to one. In contrast, those data of the n datastreams present at the input $E_i$ in which the binary coefficient $a_{i,j}$ assumes the value zero are not included in the compacting in the jth run.

The k control points $v_1, \ldots, v_k$ are determined by the k binary equations $$v_1 = a_{1,1}u_1 \oplus \ldots \oplus a_{1,n}u_n$$
$$\vdots$$
$$v_k = a_{k,1}u_1 \oplus \ldots \oplus a_{k,n}u_n$$

from the n information points. This information enables an expert easily to determine the information points $u_1, \ldots, u_n$ and the control points $v_1, \ldots, v_k$ from the test data and from the signatures.

From the control points ($v_k$) and from the information points ($u_n$), the expert can then determine the errored elements, particularly the errored values and the correct values of the faulty cells of the integrated circuit.

The method according to the invention makes it possible to locate the test signals of the diagnosed circuit output with errors by means of the signatures, using information and control points. The method according to the invention is generally suitable for the circuit test by means of parallel datastreams and can be applied particularly well in integrated circuits with scan paths.

According to the invention, those cells and scan cells of the integrated circuit in which test signals with errors have occurred during the test can be located accurately and rapidly by means of the compacted data. This determination of the faulty cells is performed by comparing the control points generated according to the above rule with control bits which are stored in the tester or which are determined in the tester by simulation. In such a comparison, the syndrome is generated from which the errored information point can be unambiguously determined. The method according to the invention can be flexibly adapted to the frequency and to the distribution of errors to be expected. The method according to the invention can be used for performing a 100% diagnostic analysis in the course of production, which supplies distinctly better results than sampling checks. The expenditure, the speed and the costs for such a check are optimized when the method according to the invention is used.

A further advantage of the method according to the invention lies in the reduction of the data volume needed for determining the failing elements or scan elements, both in the reduction of the data to be recorded for the integrated circuit to be tested and in the reduction of the design data of the integrated circuit, to be stored for the fault location. It is also particularly advantageous that the method according to the invention is error-independent, i.e. that no individual settings are necessary for being able to calculate back to a particular error.

The method achieves its highest performance if a large number of errors are to be determined within a particular test area, especially since the method calculates all errors in an interval without additional expenditure. In parallel tests with a very high degree of parallelity, all integrated circuits can be dealt with identically and thus diagnosed at the same time.

This case is given in the test of integrated circuits by means of scan paths for the first n test vectors. In the practical application of the method according to the invention, it was possible to confirm that a high number of integrated circuits could be diagnosed sufficiently well with the failures from the first n test vectors. The method according to the invention can thus be used for data generation accompanying production for analyzing failure causes.

Due to the fact that the design-specific data needed for calculating back are reduced, the use of on-line analysis programs or on-line analysis tools on the tester can be facilitated during the evaluation and ramp-up phase. The necessary data can also be kept within the productive test program. This obviates the need for a special analysis program.

The method can also be applied to a design which contains a number of structures of multi-input signature registers since the feedbacks of the multi-input signature registers are disconnected during the diagnostic analysis and thus the individual multi-input signature registers can be connected together to form one large multi-input signature register.

In the method according to the invention, the compactor can be formed on any plane of abstraction and measuring equipment, as described, and be present on the circuit to be tested and/or to be diagnosed itself, on the probe card, on the load board or on the tester. This results in a rapid and reliable conduct of the process with accurate test and diagnostic results.

According to an advantageous embodiment of the method according to the invention, the switching units can be activated by means of a control signal, before the test data are detected and processed, in such a manner that the input signals present at the internal inputs of the switching units are combined with the test data in each case present at the external inputs and that the combination values in each case determined from these combinations are forwarded to the internal inputs of the switching units in each case arranged downstream. In this process, in particular, all control signals $c_{i,j}$ of the multiplexers can be selected to be one. This ensures that first the actual signatures of the circuit to be tested and/or to be diagnosed are determined from the datastreams.

If the compactor has a feedback unit, this can be activated, according to the invention, in such a manner that no values are fed back.

In one embodiment, t is particularly advantageous if the method of the diagnostic mode is performed as follows.

Carrying out k successive test runs, a control point $(v_k)$ being determined with each run in accordance with the rule already specified from the information points $(u_n)$ until all control points $(v_k)$ have been determined. The coefficients $a_{i,j}$ assume the values zero or one. The switching units of the electrical diagnostic circuit are controlled in such a manner that the test data present at the jth external input $(E_j)$ in the ith run are only subjected to a combination in the switching units if the control signal $c_{i,j}$ assumes the value one. The control signal $c_{i,j}$ assumes the value zero if the associated coefficient $a_{i,j}$ assumes the value zero or if an indeterminate value in the datastream is to be blanked out.

The method step of the diagnostic mode can also be executed as follows.

Carrying out k successive test runs, the control of the switching units of the electrical diagnostic circuit being controlled in accordance with the binary coefficients $a_{i,j}$ of the equations for determining the control points $v_1, \ldots, v_k$ of a linear separable error-correcting code with n information points $u_1, \ldots, u_n$ and with k control points $v_1, \ldots, v_k$, in such a manner that the test data present at the jth external input $(E_j)$ in the ith run are only subjected to a combination in the switching units of the electrical diagnostic circuit when the binary control signal $c_{i,j}$ assumes the value one.

In an advantageous development of the method according to the invention, the multiplexers of the switching units are controlled by the control signal.

The method according to the invention can also be used for testing and/or for the diagnostic analysis of printed board assemblies or of circuit boards. In this arrangement, the same advantages are essentially obtained which are also obtained during the test and/or during the diagnostic analysis of integrated circuits.

The invention is also realized in a computer program for carrying out the method for testing and/or for diagnosing an integrated circuit. The computer program contains program instructions which cause a computer system to execute such a method in an embodiment described above. In this context, in particular, the method steps beginning with controlling the switching units or beginning with controlling the feedback unit are controlled by means of a computer system or performed on a computer system itself. As a result, the computer program outputs the faulty cells or scan cells of the tested and diagnosed integrated circuit on an output unit, particularly on a screen or on a printer. If the computer program according to the invention has not found any errors in the diagnosed integrated circuit, a message about the full functionality of the integrated circuit is output.

The computer program according to the invention can be used for testing integrated circuits rapidly, effectively and reliably.

The invention also relates to a computer program which is contained on a storage medium, particularly in a computer memory or in a random access memory or which is transmitted on an electrical carrier signal. The invention also relates to a carrier medium, particularly a data storage medium such as a floppy disk, a zip drive, a streamer, a CD or a DVD on which a computer program described above is stored. Furthermore, the invention relates to a computer system on which such a computer program is stored. Finally, the invention also relates to a downloading method in which such a computer program is downloaded from an electronic data network such as from the Internet, to a computer connected to the data network.

The following approach can be used as an estimation of the test time saved by the method according to the invention: assuming a semiconductor chip with 500 000 flipflops which are divided into 2 000 scan chains of 250 scan flipflops each. The test data are compressed by means of a multi-input signature register. Assuming that, due to the degree of parallelity, two semiconductor chips share one pattern generator (i.e., 2 semiconductor chips can be stimulated independently of other semiconductor chips). At a shift frequency of 50 MHz, the pattern run time of 100 scan loads is 0.5 ms. The pattern start time is 1 ms which is a current value of the production testers J750, J971. If 20 errors are to be detected in the 100 scan loads, the pattern would have to be started 40 times in conventional methods, a reduced number of scan elements is read out at the failure points and then the pattern is discontinued. Assuming half the pattern run time on average for the application time of these 40 repetitions, the pattern run time for the diagnostic analysis is 50 ms (40*1.25 ms) and in addition, 20*2 000=40 000 values would have to be read from the memory. To arrive at reasonable read times of the error information, the tester would very probably have to be equipped with a special memory MTO since the standard error memory only comprises 256 vectors. The time for storing the data shall be neglected here for reasons of lacking data. In general, read/write accesses are rather time consuming. The proposed method only needs one pattern generator in the entire test system. Because of the logarithmic dependence on the MISR length, the scan test would only have to be started $\log_2(2\,000)=11$ times, $3*\log_2(2\,000)=33$ times with a reduced error probability of the method. The pattern run time of the diagnostic analysis is $11*1.5=16.5$ ms or 49.5 ms, respectively, and a total of $20*11=220$ or 660 values would have to be stored and read which is why no MTO is used. Apart from saving test time, the requirements of the proposed method for the test system are also much lower.

In summary, it can be stated that the invention relates to a method and to an arrangement for compressing test data and/or diagnostic data of a circuit having n outputs $A_0, \ldots, A_{n-1}$ by using a linear separable and error-correcting block code with n information points $u_0, \ldots, u_{n-1}$ and with k control points $v_0, \ldots, v_{k-1}$. The control points are determined by the equation $$v_1 = a_{1,1}u_1 \oplus \ldots \oplus a_{1,n}u_n$$
$$\vdots$$
$$v_k = a_{k,1}u_1 \oplus \ldots \oplus a_{k,n}u_n$$

from the information points and the coefficients $a_{i,j}$, $1 \leq i \leq k$, $1 \leq j \leq n$ assume the values zero or one. The n circuit outputs $A_1, A_2, \ldots, A_n$ of the circuit to be tested and/or to be diagnosed are connected to n inputs $E_1, \ldots, E_n$ of a controlled compactor C having at least n inputs and m outputs in k successive runs. It holds true that $m \geq 1$. In the k successive runs, the controlled compactor, depending on the binary control signals $C_{i,j}$, $1 \leq i \leq k$, $1 \leq j \leq n$ present on its control lines, does not include the value present at its jth input $E_j$ in each case in the ith run in the compacting if the control signal $c_{i,j}$ assumes the value zero. If the coefficient $a_{i,j}$ in the system of equations for determining the control point $v_i$ of the linear separable block code assumes the value zero, the control signal $c_{i,j}$ is equal to zero. In the k successive runs, the same data are in each case output from the circuit to be tested and/or to be diagnosed. To determine the errored outputs of the circuit to be tested and/or to be diagnosed, the data actually obtained and compacted by the controlled compactor are compared with the compacted correct data for the error-free circuit in the k successive runs. The compacted correct data for the error-free circuit can be determined by circuit simulation as is usual in the design of electronic circuits.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

The invention is illustrated in greater detail in the drawings with reference to an exemplary embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
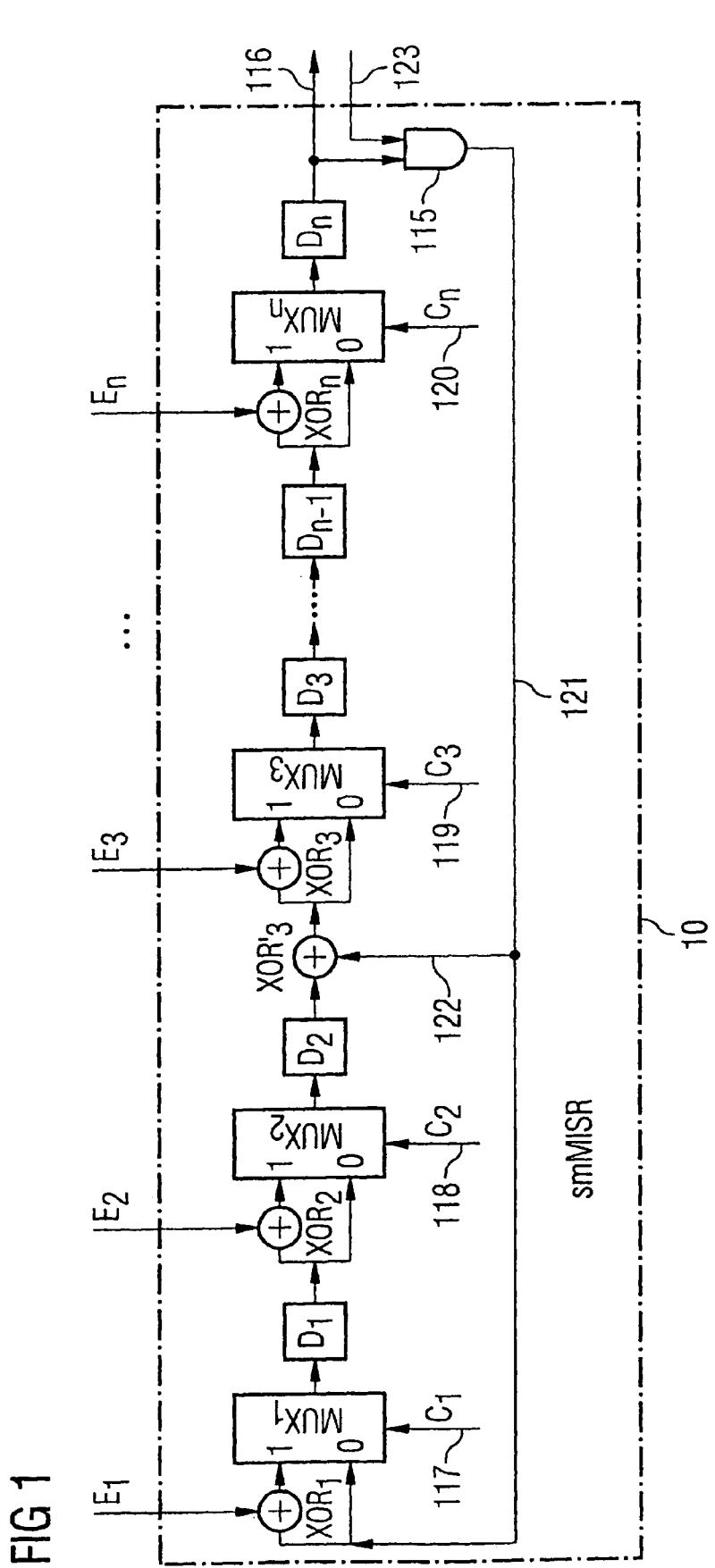
FIG. 1 illustrates a first compactor circuit of a first controllable compactor.

FIG. 1 illustrates a first compactor circuit 10 of a first controllable compactor.

The controllable compactor shown in FIG. 1 is a modified signature register of second type according to document L. Voelkel and J. Pliquet: Signaturanalyse, Akademie-Verlag, Berlin, 1988.

The first compactor circuit 10 can also be called a modified multi-input signature register and comprises n inputs $E_1$, $E_2$, $E_3, \ldots, E_n$ and an output 116. The first compactor circuit 10 furthermore comprises n storage elements $D_1, D_2, D_3, \ldots, D_{n-1}, D_n$; n multiplexers $MUX_1, MUX_2, MUX_3, \ldots, MUX_n$; n exclusive OR gates $XOR_1, XOR_2, XOR_3, \ldots, XOR_n$ and a further exclusive OR gate $XOR'_3$. OR gates designated by XOR in the text which follows, always represent exclusive OR gates.

The multiplexers $MUX_1$-$MUX_n$ in each case have a zero input and a one input and in each case a control input 117-120 at which a binary control signal $c_1, c_2, c_3, \ldots, c_n$ is in each case present. The inputs $E_1$-$E_n$ in each case lead to the first input of the OR gates $XOR_1$-$XOR_n$. The compactor output 116 is attached to the output of the storage element $D_n$. Furthermore, a first controlled AND gate 115 is provided, the first input of which branches off from the compactor output 116 and the second input of which is formed by an external first control signal input 123 which carries the control signal d. The output of the first controlled AND gate 115 is formed by the feedback line 121 which is conducted to the zero input of the first multiplexer $MUX_1$ and to the second input of the first OR gate $XOR_1$. A second feedback line 122 branches off from the first feedback line 121 to the second input of the OR gate $XOR'_3$.

According to one embodiment of the invention, feedback lines are in each case conducted to the second input of an OR gate $XOR'_i$, the first input of which is connected to the output of the upstream storage element $D_{i-1}$ and the output of which is connected to the zero input of the downstream multiplexer $MUX_1$ and, in parallel, via the downstream OR gate $XOR_1$, to the one input of the downstream multiplexer $MUX_i$. If, for example, it is intended to implement a shift register with linear feedback and of maximum length for an actual value n, the required feedback lines are determined by the coefficients of a primitive feedback polynomial of degree n as is described, for example, in document P. H. Bardell, W. H. McAnney and J. Savir: "Built-In Test for VLSI: Pseudorandom Techniques", New York, 1987, pp. 285-287. The exact selection of feedback lines is known to an expert and will not be explained further here.

The output of the first OR gate $XOR_1$ is conducted to the one input of the first multiplexer $MUX_1$. The output of the first multiplexer $MUX_1$ leads to the first storage element $D_1$, the output of which is connected to the zero input of the second multiplexer $MUX_2$ and to the second input of the second OR gate $XOR_2$. The output of the second OR gate $XOR_2$ is connected to the one input of the second multiplexer $MUX_2$. The output of the second multiplexer $MUX_2$ is connected to the second storage element $D_2$.

The inputs of the OR gate $XOR'_3$, which directly follows the second storage element $D_2$, are connected to the output lines of the second storage element $D_2$ and to the second feedback line 122. The output line of the OR gate $XOR'_3$ is connected to the zero input of the third multiplexer $MUX_3$ and, in parallel, to the first input of the third OR gate $XOR_3$, the output of which is connected to the one input of the third multiplexer $MUX_3$.

The output of the third multiplexer $MUX_3$ is connected to the third storage element $D_3$. This type of series-connection of the OR gates XOR, of the multiplexers MUX and of the storage elements D is correspondingly constructed for the further elements $XOR_4, \ldots, XOR_n$; $MUX_4, \ldots, MUX_n$ and $D_4, \ldots, D_n$.

If the control signal d=1 is applied to the first control signal input 123, the feedback logic is switched on. If the value d=0 is selected at the first control signal input 123, the output of the storage element $D_n$ is not fed back.

If the control signal $c_i$ of the multiplexer $MUX_i$ assumes the value zero, the value stored in the previous storage element $D_{i-1}$ is transferred in the next clock cycle into the storage element $D_i$ via the multiplexer $MUX_i$ and the value present at the input $E_i$ of the multiplexer $MUX_i$ is not forwarded.

Thus, the value present at input $E_i$ is not replaced by a fixed value, for example by the value zero, which would not have any effect in the combination performed in the corresponding OR gate XOR. Instead, if a control value $c_i$=0 is present at the control line of a multiplexer $MUX_i$, there is no connection from the input $E_i$ to the downstream storage element $D_i$.

The parallel feedback of the output signal of the storage element $D_n$ via the feedback lines 121 and 122 operates as follows.

If the control line 119 of the third multiplexer $MUX_3$ carries the control signal $c_3$=1, the output signal of the storage element $D_n$ is fed back via the feedback line 122, via the OR gate $XOR'_3$, via the third OR gate $XOR_3$ and via the third multiplexer $MUX_3$ into the third storage element $D_3$. If, in contrast, the control input 119 of the third multiplexer $MUX_3$ carries the control signal $c_3$=0, the output signal of the storage element $D_n$ is fed back via the OR gate $XOR'_3$ and via the multiplexer $MUX_3$.

If the control input 117 of the first multiplexer $MUX_1$ carries the control signal $c_1$=0, the output signal of the storage element $D_n$ is fed back via the first feedback line 121 and via the first multiplexer $MUX_1$ into the first storage element $D_1$. If the control signal $c_1$ on the first control line 117 assumes the value one, in contrast, the output signal of the storage element $D_n$ is fed back via the first OR gate $XOR_1$ and via the first multiplexer $MUX_1$ into the first storage element $D_1$.

If all control lines 117-120 carry the control signals $c_1, c_2, \ldots, c_n$=1 and if additionally the control signal d=1 is present at the first control signal input 123, the controllable compactor operates via a multi-input signature register with linear feedback.

If all control lines 117-120 carry control signals $c_1, c_2, \ldots, c_n$=0 at a particular time and if, at the same time, the control signal value d=1 is applied to the first control signal input, the values of the inputs $E_1, E_2, \ldots, E_n$ are not subjected to an OR combination with the values stored in the storage elements $D_1, D_2, \ldots, D_n$ by the OR gates $XOR_1, XOR_2, \ldots, XOR_n$, especially since the storage elements $D_1, D_2, \ldots, D_n$ are in this case in each case connected to the zero inputs of the multiplexers $MUX_1, MUX_2, \ldots, MUX_n$.

Allocating values zero or one to the control signals $c_1, c_2, \ldots, c_n$ makes it possible to perform different combinations of the inputs $E_1, E_2, \ldots, E_n$ with the values stored in each case in the storage elements $D_1, D_2, \ldots, D_n$. These combinations can be selected differently at different times.

If, for example, $c_1=c_3=c_4=\ldots c_n$=1 and $c_2$=0 applies at a particular time, only the value present at the second input $E_2$ is not OR-combined with the value stored in the first storage element $D_1$ arranged upstream. The values of the remaining inputs $E_1, E_3, E_4, \ldots, E_n$, in contrast, are combined with the contents of the control signals $D_n, D_2, D_3, \ldots, D_{n-1}$ in each case arranged upstream.

Controlling the compactor in accordance with the first compactor circuit 10 by means of the control signals $c_1, c_2, \ldots, c_n$ on the control lines 117-120 does not require any additional control circuit which must be arranged between the outputs of the circuit to be tested and/or to be diagnosed as is described, for example, in document WO 01/38889 A1: Rajski, Tyzer, "Method and apparatus for selectively compacting test responses". Instead, the control is advantageously integrated into the compactor itself.

Figure 2:
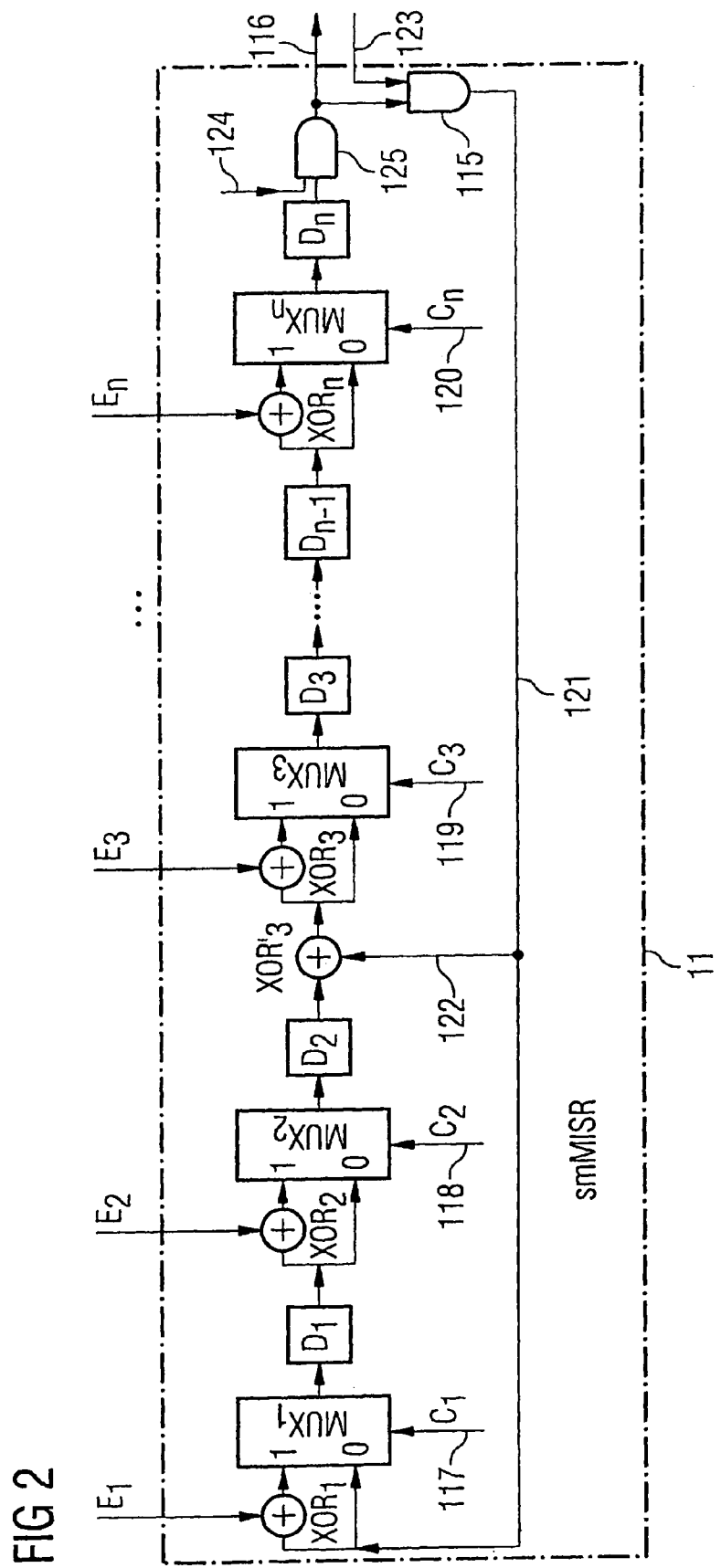
FIG. 2 illustrates a second compactor circuit of a second controllable compactor.

FIG. 2 illustrates a second compactor circuit 11 of a second controllable compactor.

The second compactor circuit 11 differs from the first compactor circuit 10 in that an additional second controlled AND gate 125 is provided. The inputs of the second controlled AND gate 125 are formed by the output of the storage element $D_n$ and by a second control signal input 124 which carries the control signal s. The output of the second controlled AND gate 125 forms the compactor output from which—as in the first compactor circuit 10—a line branches off which is conducted to the first input of the first controlled AND gate 115.

If the control signal s of the second control signal input 124 is equal to one, the controlled compactor shown in FIG. 2 is functionally equivalent to the controlled compactor shown in FIG. 1. If, in contrast, the control signal s is equal to zero, the output value of the storage element $D_n$ is set to the value zero independently of the value previously assumed by this output value of the storage element $D_n$.

In current electronic circuits, indeterminate unpredictable values often occur during the testing which are then called X values. If such an X value is output by the storage element $D_n$ at any time, the values of the storage elements $D_1$ and $D_3$ and, a few clock cycles later the contents of a number of further storage elements of the controlled compactor, are indeterminate via the feedback lines 121 and 122 which leads to an indeterminate state and to an indeterminate signature of the compactor. In this case, it is no longer possible to make reliable statements about the correctness of the circuit tested and/or diagnosed.

If in the case, where the storage element $D_n$ outputs such an indeterminate X value, the value of the control signal s of the second control signal input 124 is set to zero, such an X value is replaced by the determinate value zero. This ensures the state of the controlled compactor and its output remain predictable.

It is clear to an expert that he can also use a controlled OR gate instead of the second controlled AND gate 125. In this case, the value output by the storage element $D_n$ is replaced by the value one. Similarly, a controlled NAND gate or a controlled NOR gate could be used. The multiplexer connections can be swapped when the drive is inverted.

Figure 3:
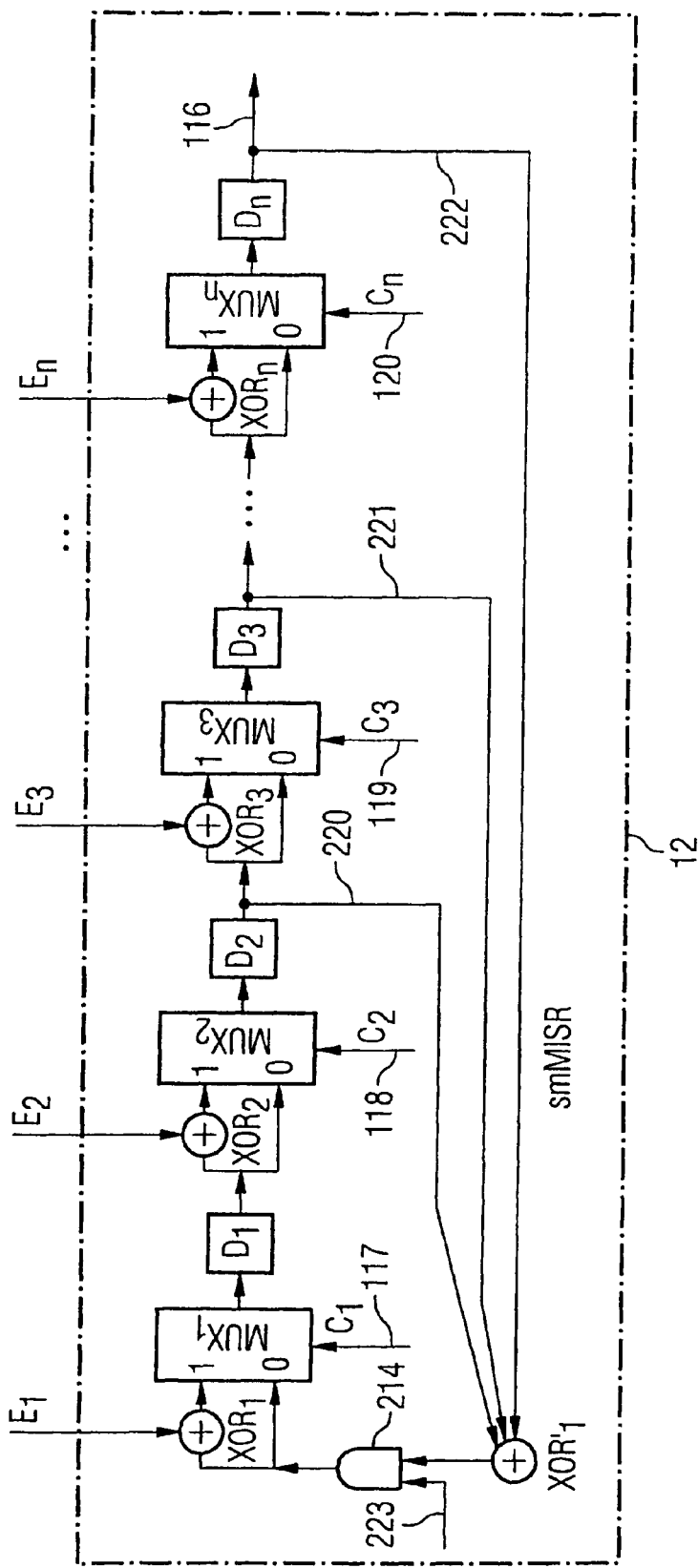
FIG. 3 illustrates a third compactor circuit of a further controllable compactor.

FIG. 3 illustrates a third compactor circuit 12 of a further controllable compactor.

The controllable compactor shown in FIG. 3 is a modified signature register of the first type according to document L. Voelkel and J. Pliquet: Signaturanalyse, Akademie-Verlag, Berlin, 1988.

Components and elements of the third compactor circuit 12 corresponding to components and elements of the first compactor circuit 10 and of the second compactor circuit 11 are marked by the same reference symbols in FIG. 3 and will not be explained separately.

According to a first difference with respect to the first compactor circuit 10, the third compactor circuit 12 does not provide an OR gate $XOR'_3$. Instead, the output of the second storage element $D_2$ is connected directly to the input of the third OR gate $XOR_3$ and, in parallel, to the zero input of the third multiplexer $MUX_3$.

According to a further distinction with respect to the first compactor circuit 10, a further OR gate $XOR'_1$ is provided in the third compactor circuit 12. The inputs of this OR gate $XOR'_1$ are connected to a feedback line 220 from the output of the second storage element $D_2$, a second feedback line 221 from the output of the third storage element $D_3$ and a further feedback line 222 from the output of the nth storage element $D_n$.

According to a further distinction with respect to the first compactor circuit 10, the first controlled AND gate 115 in the third compactor circuit 12 is replaced by a third controlled AND gate 214. The inputs of the third controlled AND gate 214 are formed by a third control signal input 223 which carries the control signal d and by the output of the OR gate $XOR'_1$. The output of the third controlled AND gate 214 leads to the zero input of the first multiplexer $MUX_1$ and, in parallel, to the input of the first OR gate $XOR_1$.

If the third control signal input 223 is occupied by the control signal d=1, the feedback logic is switched on and the output values of the storage elements $D_2$, $D_3$ and $D_n$ are fed back via the feedback lines 220, 221 and 222 and via the third controlled AND gate 214.

If the control line 117 of the multiplexer $MUX_1$ is occupied by the control signal $c_1$=0, the output signals are fed back into the first storage element $D_1$ via the zero input of the first multiplexer $MUX_1$. If the control line 117 is occupied by the control signal $c_1$=1, feedback into the first storage element $D_1$ is effected via the first OR gate $XOR_1$ and via the one input of the multiplexer 1.

If, for example, a shift register with linear feedback and maximum length is to be implemented for an actual value n, the required feedback lines are determined by the coefficients of a primitive feedback polynomial of degree n also in the third compactor circuit 13, as described, for example, in document P. H. Bardell, W. H. McAnney and J. Savir: "Built-In Test for VLSI: Pseudorandom Techniques", New York, 1987, pp. 285-287.

If all control lines 117 to 120 are occupied by the control signals $c_1, c_2, \ldots, c_n$=0 at a particular time and, at the same time, the third control signal input 223 is occupied by the control signal d=1, the values present at the inputs $E_1, E_2, \ldots, E_n$ are not combined with the values stored in the storage elements $D_1, D_2, \ldots, D_n$ because the storage elements $D_1, D_2, \ldots, D_n$ are in each case connected to the zero inputs of the multiplexers $MUX_1, MUX_2, \ldots, MUX_n$ in this case.

Analogously to compactor circuits 10 and 11, different combinations of the inputs $E_1, E_2, \ldots, E_n$ with values in each case stored in the storage elements $D_1, D_2, \ldots, D_n$ can also be implemented in the compactor described by the third compactor circuit 12 by individually specifying the values for the control signals $c_1, c_2, \ldots, c_n$ as zero or one. These combinations can be selected to be different at various times.

Figure 4:
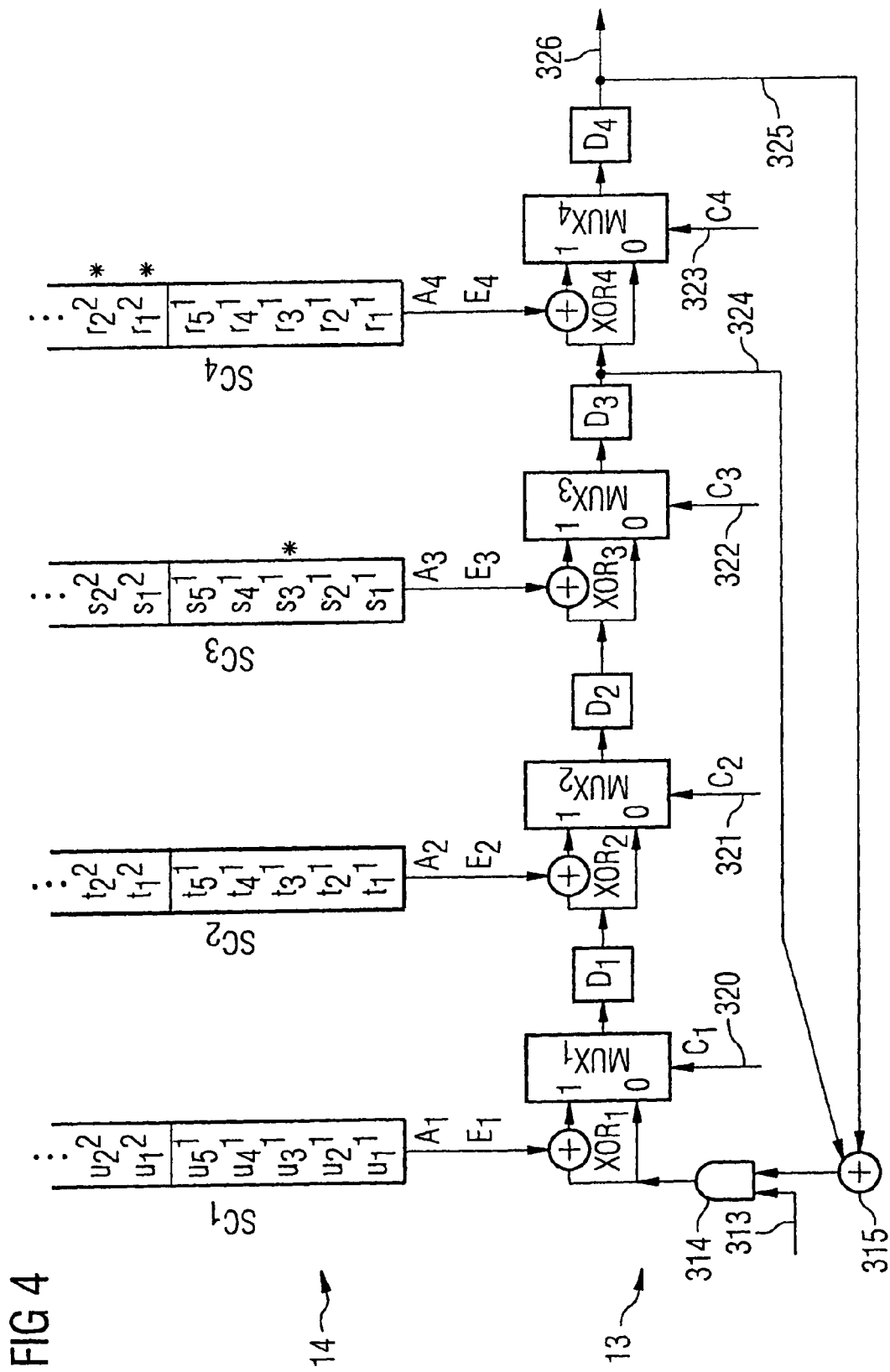
FIG. 4 illustrates a fourth compactor circuit of a further controllable compactor and a diagrammatic representation of scan paths, connected to the controllable compactor, of an integrated circuit.

FIG. 4 illustrates a fourth compactor circuit 13 of a further controllable compactor and a diagrammatic representation of scan paths, connected to the controllable compactor, of an integrated circuit 14.

The fourth compactor circuit 13 corresponds to the third compactor circuit 12, the variable n assuming the value 4 and the controllable compactor, in consequence, comprising a total of four inputs $E_1$-$E_4$, four multiplexers $MUX_1$-$MUX_4$, four exclusive OR gates $XOR_1$-$XOR_4$ and four storage elements $D_1$-$D_4$.

The control lines of the multiplexers $MUX_1$-$MUX_4$ are identified by the reference symbols 320-323, the further OR gate is identified by the reference symbol 315, the fourth controlled AND gate is identified by the reference symbol 314 and the fourth control signal input is identified by the reference symbol 313.

The integrated circuit 14 has four scan paths $SC_1$-$SC_4$. A circuit with scan paths can be operated in two different modes. Apart from a normal operating mode, a scan mode is implemented in which data can be shifted into and out of the storage elements configured as scan chains. During the test or during the diagnostic analysis, the storage elements of the scan paths, combined as scanned chain, are loaded with the test vectors or with the diagnostic vectors in scan mode. In a subsequent step, the data shifted into the storage elements of the scan paths are processed by the combinatorial circuit section of the circuit to be tested or to be diagnosed in operating mode and the result of this processing is stored in the storage elements of the circuit. The result stored in the storage elements of the scan paths is subsequently shifted out in scan mode and output at the outputs $A_1, \ldots, A_4$ of the scan paths whilst the next test or diagnostic vectors are shifted into the scan paths at the same time.

During the test of such circuits, the data output by the scan paths are accumulated to a signature in a shift register with preferably linear feedback with n parallel inputs as is known to the expert. If the signature determined does not match the signature previously calculated, the tested circuit is faulty.

A detailed description of the use of scan paths for testing and diagnosing digital circuits is not necessary here since it is known to an expert. The use of scan paths is described, for example, in document M. Abramovici, M. Breuer and A. Friedman: "Digital Testing and Testable Design", Computer Science Press, 1990.

FIG. 4 illustrates that the data $u_1^1, u_2^1, u_3^1, u_4^1, u_5^1, u_1^2, u_2^2, \ldots$ are stored in the scan path $SC_1$, the data $t_1^1, t_2^1, t_3^1, t_4^1, t_5^1, t_1^2, t_2^2, \ldots$ are stored in the scan path $SC_2$, the data $s_1^1, s_2^1, s_3^1, s_4^1, s_5^1, s_1^2, s_2^2, \ldots$ are stored in the scan path $SC_3$ and the data $r_1^1, r_2^1, r_3^1, r_4^1, r_5^1, r_1^2, r_2^2, \ldots$ are stored in the scan path $SC_4$. These data can be shifted out in the scan mode of the integrated circuit to be tested.

The integrated circuit 14 has four scan paths $SC_1$-$SC_4$. The four outputs $A_1$-$A_4$ of the integrated circuit 14 are in each case connected to the four inputs $E_1$-$E_4$ of the controllable compactor.

Firstly, the signature of the circuit to be tested is determined. In this process, all control signals $c_1, c_2, c_3, c_4$ of the multiplexers $MUX_1, MUX_2, MUX_3, MUX_4$ are selected as one. In the case of an error, the circuit must be diagnosed. The output signatures must then be determined for different value combinations of the binary control signals $c_1, c_2, c_3, C_4$ in successive runs.

It can be seen that the circuit of FIG. 4, occupied with the values of the control signals $c_1 = c_2 = C_3 = c_4 = 1$, functionally operates like a quite normal shift register with linear feedback with four parallel inputs $E_1, E_2, E_3$ and $E_4$ and the signature of a test can be formed in the usual manner known to an expert. If then the signature is errored, the diagnostic analysis is begun.

In the text which follows, the diagnostic analysis according to the invention is explained by using an error-correcting hamming code with four information points $u_1 = u, u_2 = t, u_3 = s$ and $u_4 = r$ and with three control points $v_1, v_2$ and $v_3$. Such a hamming code is known to the expert, for example from document S. Lin and D. Costello: "Error Control Coding, Fundamentals and Applications", Prentice-Hall, Englewood Cliffs, N.J., 1983, and does not need to be explained here in greater detail.

The information points are detected at inputs $E_1$-$E_4$, the control points are determined from the information points as described in the text which follows.

The control points $v_1, v_2$ and $v_3$ are determined from the correct information points by the following equations:

$$v_1 = u_1 \oplus u_2 \oplus u_3 = u \oplus t \oplus s$$

$$v_2 = u_1 \oplus u_2 \oplus u_4 = u \oplus t \oplus r$$

$$v_3 = u_1 \oplus u_3 \oplus u_4 = u \oplus s \oplus r$$

The symbol "$\oplus$" represents exclusive OR combination XOR. The correct information points are designated by $u_1, u_2, u_3$ and $u_4$ and the information points actually obtained during the test or during the diagnostic analysis are designated by $U_1, U_2, U_3$ and $U_4$.

It is assumed that a part of the information points $u_1, u_2, u_3$ and $u_4$ can be disturbed in $U_1, U_2, U_3$ and $U_4$. The relationship between the correct values and the values of the information points actually observed is usually described by the relation $$U_i = u_i \oplus e_i$$

for $i = 1, \ldots, 4$ where $e = (e_1, e_2, e_3, e_4)$ forms the error vector, the values of which are available in binary form. If $e_i = 1$, the ith information bit $U_i$ is errored. If $e_i = 0$, the ith information bit $U_i$ is correct.

From the information bits $U_1, U_2, U_3$ and $U_4$ actually obtained, the actual control points $V_1, V_2, V_3$ are determined by means of the following system of equations:

$$V_1 = U_1 \oplus U_2 \oplus U_3$$

$$V_2 = U_1 \oplus U_2 \oplus U_4$$

$$V_3 = U_1 \oplus U_3 \oplus U_4$$

Because $(U_1, U_2, U_3, U_4) = (u_1, u_2, u_3, u_4) \oplus (e_1, e_2, e_3, e_4)$, the following holds true:

$$S_1 = V_1 \oplus v_1 = e_1 \oplus e_2 \oplus e_3$$

$$S_2 = V_2 \oplus v_2 = e_1 \oplus e_2 \oplus e_4$$

$$S_3 = V_3 \oplus v_3 = e_1 \oplus e_3 \oplus e_4$$

where $(S_1, S_2, S_3)$ usually called the syndrome of the error $(e_1, e_2, e_3, e_4)$, which in this case only relates to the information points, in the theory of the error-correcting code.

It can be seen that each error which corrupts one bit of the information points can be detected from its different syndrome. Thus, the one-bit errors, which can be described by the error vectors (1,0,0,0), (0,1,0,0), (0,0,1,0) and (0,0,0,1), and which corrupt the first, the second, the third and the fourth information bit, lead to different syndromes (1,1,1), (1,1,0), (1,0,1) and (0,1,1).

If no error is present and $(e_1, e_2, e_3, e_4) = (0,0,0,0)$ applies to the error vector, the syndrome is (0,0,0).

If then simply the XOR sums $S_1 = V_1 \oplus v_1$, $S_2 = V_2 \oplus v_2$ and $S_3 = V_3 \oplus v_3$ are determined from the observed and the correct control points of the hamming code, the values of the syndrome of any error which may be present are obtained from which the associated error vector, and thus the point which has been corrupted in the information points, can be inferred in the case of an error which only corrupts one bit of the information points.

In the test mode, the value of the control signal present on the control line 313 is set as $d = 1$. This makes it possible to calculate the signature. This is known to the expert and does not need to be explained further, therefore.

In diagnostic mode, the value of the control signal present on the control line 313 is set as $d = 0$ so that the output of the fourth controlled AND gate 314 becomes equal to zero and the feedback logic of the fourth controllable compactor is interrupted. At the output 326 of the fourth controllable compactor, the values $y_0, y_1, y_2, \ldots$ output successively, are then observed. They represent the sequence of output values or, respectively, the output signature. If the storage elements $D_1, D_2, D_3$ and $D_4$ are zero in their initial state, the following holds true for specified values $c = (c_1, c_2, c_3, c_4)$ of the control signals of the control lines 320, 321, 322 and 323 for the values output at output 326:

$$y_0 = 0$$

$$y_1(c) = c_4 r_1^1$$

$$y_2(c) = c_4 r_2^1 \oplus c_3 s_1^1$$

$$y_3(c) = c_4 r_3^1 \oplus c_3 s_2^1 \oplus c_2 t_1^1$$

$$y_4(c) = c_4 r_4^1 \oplus c_3 s_3^1 \oplus c_2 t_2^1 \oplus c_1 u_1^1$$

$$y_5(c) = c_4 r_5^1 \oplus c_3 s_4^1 \oplus c_2 t_3^1 \oplus c_1 u_2^1$$

$$y_6(c) = c_4 r_1^2 \oplus c_3 s_5^1 \oplus c_2 t_4^1 \oplus c_1 u_3^1$$

$$y_7(c) = c_4 r_2^2 \otimes c_3 s_1^2 \oplus c_2 t_5^1 \oplus c_1 u_4^1$$

$$\vdots$$

This can also be written as $$y(c_1, c_2, c_3, c_4) = c_4 r \oplus c_3 s \oplus c_2 t \oplus c_1 u$$

in compact form.

r, s, t, u and y here designate the following column vectors:

$$r = \lfloor r_1^1, r_2^1, r_3^1, r_4^1, r_5^1, r_1^2, r_2^2, r_3^2, \ldots \rfloor$$

$$s = \lfloor 0, s_1^1, s_2^1, s_3^1, s_4^1, s_5^1, s_1^2, s_2^2, \ldots \rfloor$$

$$t = \lfloor 0, 0, t_1^1, t_2^1, t_3^1, t_4^1, t_5^1, s_1^2, s_2^2, \ldots \rfloor$$

$$u = \lfloor 0, 0, 0, u_1^1, u_2^1, u_3^1, u_4^1, u_5^1, \ldots \rfloor$$

$$y(c) = [y_1(c), y_2(c), y_3(c), \ldots]$$

The following 4-bit words $$\lfloor r_1^1, 0, 0, 0 \rfloor, \lfloor r_2^1, s_1^1, 0, 0 \rfloor, \lfloor r_3^1, s_2^1, t_1^1, 0 \rfloor, \lfloor r_4^1, s_3^1, t_2^1, u_1^1 \rfloor, \lfloor r_5^1, s_4^1, t_3^1, u_2^1 \rfloor, \lfloor r_1^2, s_5^1, t_4^1, u_3^1 \rfloor, \lfloor r_2^2, s_1^2, t_5^1, u_4^1 \rfloor$$

are then in each case interpreted as the four information points of the error-correcting hamming code observed, with four information points and with three control points.

The output signatures $y_1(c), y_2(c), y_3(c), y_4(c), y_5(c), y_6(c), y_7(c), y_8(c)$, are then those values of the control points of the hamming code which correspond to the actual value of the control variables $c = (c_1, c_2, c_3, c_4)$. The number of control points is equal to 3 and accordingly, the test must be repeated three times. During the three repetitions of the test, the values of the control variables $c = (c_1, c_2, c_3, c_4)$ of the control lines 320-323 of the multiplexers $MUX_1$, $MUX_2$, $MUX_3$ and $MUX_4$ are selected in accordance with the coefficients in the equations for determining the control points for the information points of the code.

The first control point $v_1$ is determined as $v_1 = u \oplus t \oplus s$. The values of the control signals for the first application of the test are therefore $c_1=1, c_2=1, c_3=1, c_4=0$.

The second control point $v_2$ is determined as $v_2 = u \oplus t \oplus r$. The values of the control signals for the second application of the test are, therefore, $c_1=1, c_2=1, c_3=0, c_4=1$.

For the third control point $v_3$, $v_3 = u \oplus s \oplus r$ applies which is why the values of the control signals for the third application of the test are $c_1=1, c_2=0, c_3=1, c_4=1$.

The syndrome at time i is designated by $S^i$. The syndrome $$S^i = (S_i^1, S_i^2, S_i^3)$$

forms the XOR sum of the control points of the correct circuit and the control points of the tested circuit which may be errored.

The following applies for the hamming code considered.

$$S_i^1 = y_i^k(1,1,1,0) \oplus y_i^b(1,1,1,0)$$

$$S_i^2 = y_i^k(1,1,0,1) \oplus y_i^b(1,1,0,1)$$

$$S_i^3 = y_i^k(1,0,1,1) \oplus y_i^b(1,0,1,1)$$

where the one-dimensional outputs of the controlled compactor, which are also called output signature, are designated with $y_i^k(c)$ without feedback for the error-free circuit and as $y_i^b$ for the circuit actually observed which may be faulty. The values of the correct error-free circuit are usually determined by simulation.

If, for example, $S_1 = S_2 = S_3 = (0,0,0)$, $S_4 = (1,1,0)$, $S_5 = (0,0,0)$, $S_6 = (1,1,1)$ and $S_7 = (1,1,1)$, the error vectors corresponding to the syndromes are $e_1 = e_2 = e_3 = e_5 = (0,0,0,0)$, $e_4 = (0,1,0,0)$, $e_6 = (1,0,0,0)$ and $e_7 = (1,0,0,0)$.

It can be seen that the second bit in the fourth block $[r_4^1, s_3^1, t_2^1, u_1^1]$, and thus the value $s_3^1$, the first bit in the sixth block $[r_1^2, s_5^1, t_5^1, u_3^1]$, and thus the value $r_1^2$, and the first bit in the seventh block $[r_1^2, s_1^2, t_5^1, u_4^1]$, and thus the value $r_2^2$ are identified as corrupted.

The errored scan cells have been marked by the symbol "*" in FIG. 4.

Similarly to the exemplary embodiment described, a multiplicity of errored scan cells are correctly identified by simple error-correcting hamming code in the general case. If a hamming code is used, the single restriction for error detection lies in the fact that two scan cells which are simultaneously errored must not be located on a secondary diagonal in the scan paths. Such a secondary diagonal would be described, for example, by the ith cell in the scan path $SC_1$, by the (i+1)th cell in the scan path $SC_2$, by the (i+2)th cell in the scan path $SC_3$, and by the (i+3)th cell in the scan path $SC_4$.

If such a condition cannot be accepted, another error-correcting linear block code, for example a so-called BCH code can be used as described, for example, in document M. Abramovici, M. Breuer and A. Friedman: "Digital Testing and Testable Design", Computer Science Press, 1990. It is then possible to correctly identify up to T errored scan cells which are located on a diagonal, T being a selectable parameter of the code.

In the text which follows it is explained how an indeterminate value, which is also called an X value, is treated in the controllable compactor.

Assuming that the value $t_2^1$ in the scan path $SC_2$ is indeterminate so that, in the test performed, it is not possible to predict whether $t_2^1$ assumes the value 0 or 1. If the indeterminate value $t_2^1$ is output at the output $A_2$ of the scan path $SC_2$, the control signal $c_2$ on the control line 321 of the multiplexer $MUX_2$ must be set to the value 0 so that the output of the storage element $D_1$ is conducted via the 0 input of the multiplexer $MUX_2$ into the input of the following storage element $D_2$. There is then no connection from input $E_2$ into the following storage element $D_2$ so that the indeterminate value $t_2^1$ does not have any influence on the values in the storage elements $D_1$-$D_4$ of the controllable compactor. In this arrangement, it is not necessary to set the indeterminate value $t_2^1$ to a determinate value in order to ensure the presence of a defined value in the storage elements $D_1$-$D_4$.

Figure 5:
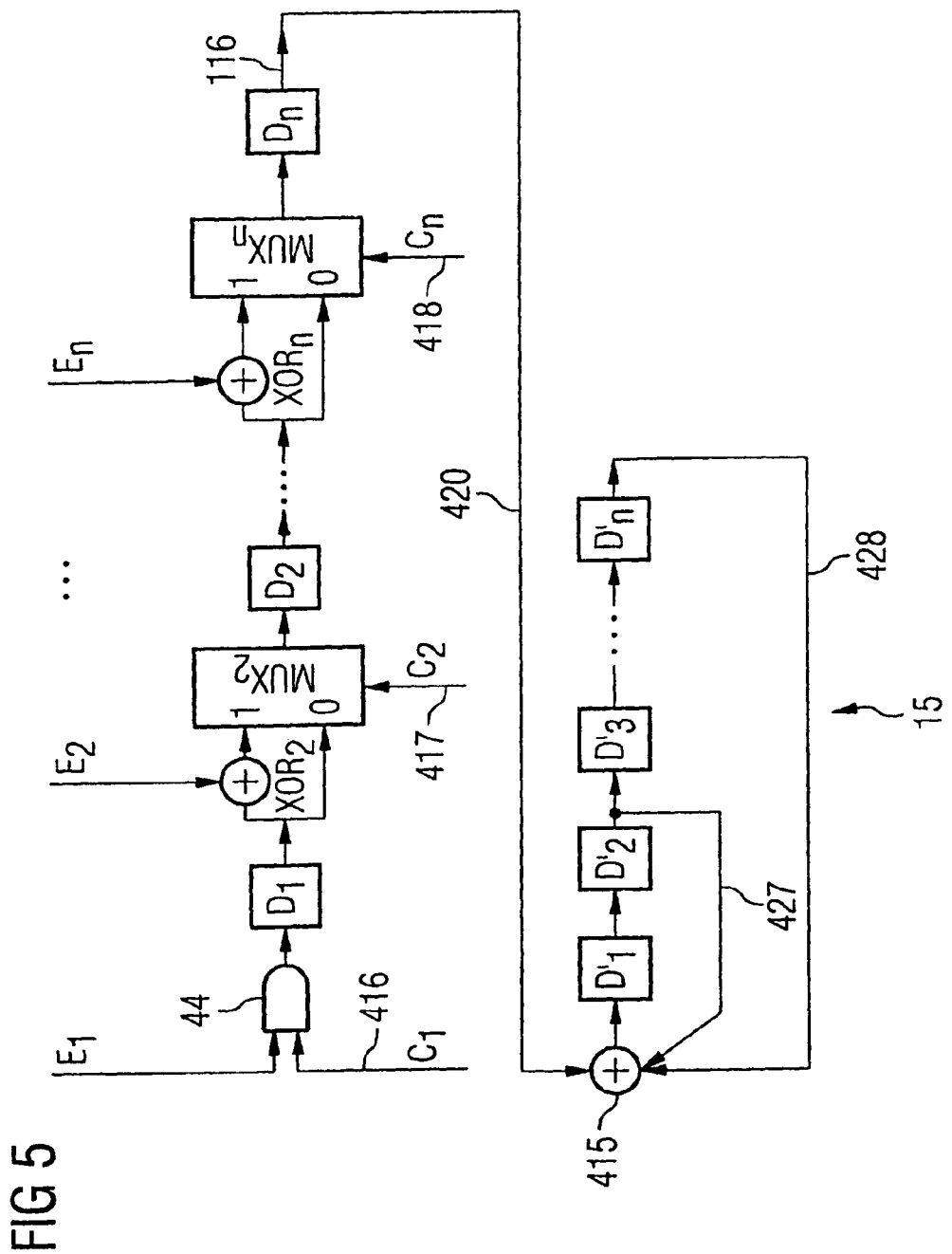
FIG. 5 illustrates a fifth compactor circuit of a further controllable compactor.

FIG. 5 illustrates a fifth compactor circuit 15 of a further controllable compactor.

The fifth compactor circuit 15 corresponds to the first compactor circuit 10, an AND gate 44, the output of which leads to the first storage element $D_1$, being provided instead of the first OR gate $XOR_1$ and instead of the multiplexer $MUX_1$. The two inputs of the AND gate 44 are formed by the first input $E_1$ and by the control line 416 which carries the control signal $c_1$.

The control lines 417 and 418 of the second multiplexer $MUX_2$ and of the nth multiplexer $MUX_n$ correspond to the control lines 118 and 120 shown in FIG. 1. Using the control lines 417 and 418, the control signals $c_2$ and $c_n$ can be applied to the multiplexers $MUX_2$ and $MUX_n$.

The output 116 of the storage element $D_n$ is connected to an input of an OR gate 415 via a data line 420. The output of the exclusive OR gate 415 is connected to the input of a storage element $D'_1$. The output of the storage element $D'_1$ is conducted to the input of the storage element $D'_2$. The output of the storage element $D'_2$ is connected, on the one hand, to the input of the storage element $D'_3$ and, on the other hand, fed back to a further input of the exclusive OR gate 415 via a feedback line 427. The output of the storage element $D'_3$ is connected to the input of the next storage element. The output of the mth storage element $D'_m$ is fed back to a further input of the exclusive OR gate 415 via a further feedback line 428.

The exclusive OR gate 415 and the storage elements $D'_1$, $D'_2, D'_3, \ldots, D'_m$ together with the feedback lines 427 and 428 form a shift register with linear feedback. The design of such a shift register with linear feedback is known to the expert and will not be explained further, therefore.

If the feedback is continuously not needed for operating the controllable compactor according to the first compactor circuit 10 from FIG. 1, the control signal d on the control line 123 is continuously equal to zero. The feedback lines 121 and 122 then continuously carry the value zero which is then also continuously present at the zero input of the first multiplexer $MUX_1$ and at the second input of the first XOR gate $XOR_1$. It can be noticed that the first multiplexer $MUX_1$ with the upstream first XOR gate $XOR_1$ is logically equivalent to an AND gate with the two inputs $c_1$ and $E_1$, the output of which is conducted to the storage element $D_1$.

In this case, an expert will simply omit the AND gate 115 and the feedback lines 121 and 122 and replace the first multiplexer $MUX_1$ with the control signal $c_1$ and with the upstream first XOR gate $XOR_1$ with a simple AND gate, at the first input of which the first input $E_1$ is connected and the second input of which carries the control signal $c_1$ of the saved multiplexer $MUX_1$.

Figure 6:
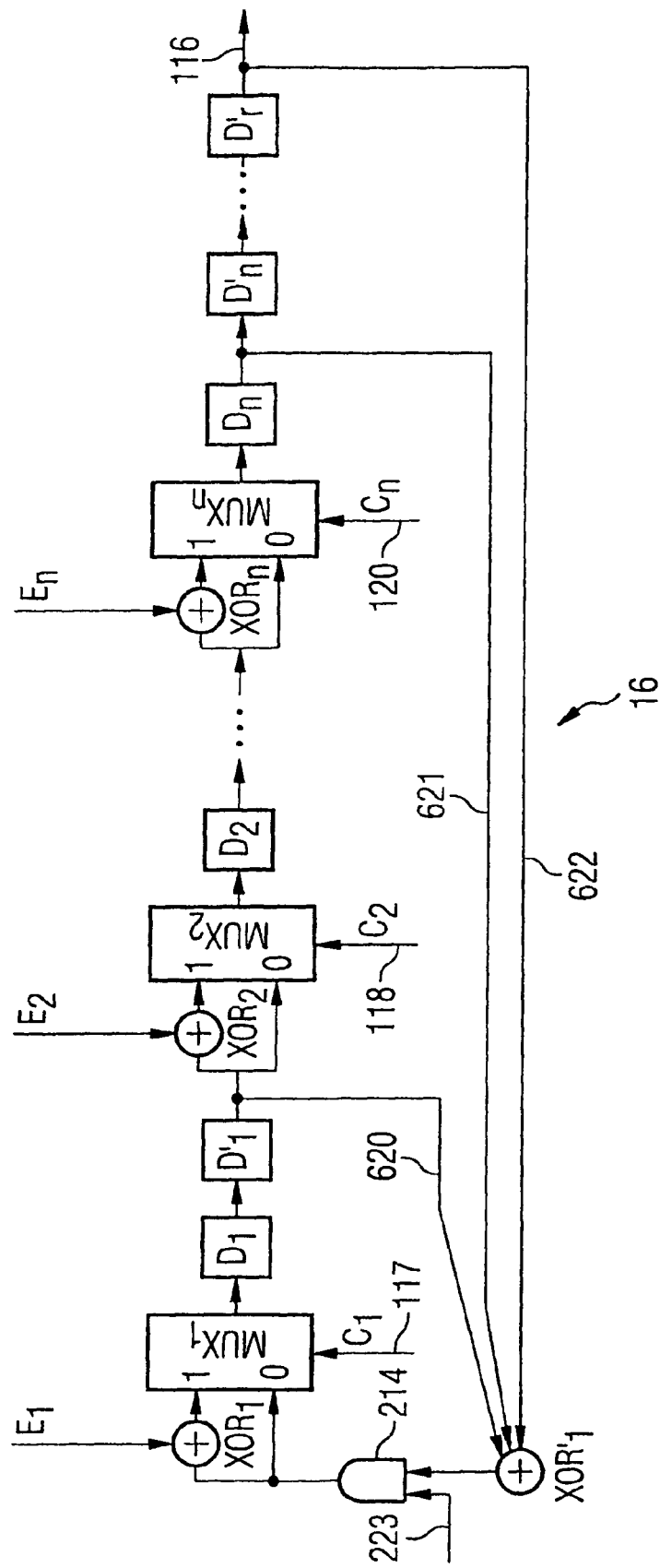
FIG. 6 illustrates a sixth compactor circuit of a further controllable compactor.

FIG. 6 illustrates a sixth compactor circuit 16 of a further controllable compactor.

The sixth compactor circuit 16 corresponds to the third compactor circuit 12, the sixth compactor circuit 16 having further storage elements $D'_1, D'_2, \ldots D'_n$ into which no inputs of the scan paths can be coupled. These further storage elements $D'_1, D'_2, \ldots D'_n$ are in each case arranged directly following the storage elements $D_1, D_2, \ldots D_n$. At the end of the sixth compactor circuit 16, further storage elements $D'_n, \ldots D'_k$ are located. In the controllable compactor according to the sixth compactor circuit 16, the number of storage elements is greater than the number of inputs $E_1, \ldots, E_n$.

The feedback lines 620-622 in each case branch off after the storage element $D'_1$, after the storage element $D_n$ and after the last storage element $D'_r$ to the inputs of the OR gate $XOR'_1$.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electrical diagnostic circuit for the testing and/or the diagnostic analysis of an integrated circuit comprising:
 a plurality of external inputs ($E_n$) for receiving digital values;
 a plurality of essentially similar, series-connected switching units comprising:
  each switching unit is connected to one external input for receiving a test signal of an integrated circuit;
  each switching unit has an internal input for an input signal from a switching unit arranged upstream or downstream,
  the switching units are configured to be controllable such that an input signal present at the internal input of a switching unit, in dependence on a control signal of the switching unit, is forwarded either unchanged to the internal input of the switching unit arranged downstream or to the circuit output and/or are fed back to an internal input of a switching unit arranged upstream, or are combined with the test signal in each case present at the external input and the combination value determined from this combination is forwarded to the internal input of the switching unit in each case arranged downstream or to the circuit output and/or is fed back to the internal input of one of the switching units arranged upstream; and
 a circuit output for outputting an output value.

2. The electrical diagnostic circuit of claim 1, comprising wherein each switching unit has one gate, comprising an exclusive OR gate, one multiplexer and one storage unit.

3. The electrical diagnostic circuit of claim 2, comprising wherein each external input ($E_n$) leads to one input each of the exclusive OR gate, each internal input leading to one external input each of the multiplexer arranged downstream and, in parallel, to one second input each of the associated exclusive OR gate, each output of the exclusive OR gate leading to one second input each of the multiplexer and each output of the multiplexer leading to one input each of the storage element, the output of which represents the output of the switching unit.

4. The electrical diagnostic circuit of claim 2, comprising wherein the internal input of at least one switching unit, in dependence on the control signal of the switching unit, is connected to the first input of the multiplexer or to the second input of the exclusive OR gate.

5. The electrical diagnostic circuit of claim 1, comprising wherein the electrical diagnostic circuit has a controllable feedback unit, connected to the circuit output, which is constructed in such a manner that the output value is fed back to at least one internal input of a switching unit.

6. The electrical diagnostic circuit of claim 5, comprising wherein the feedback unit is present as a controllable gate, particularly as a controllable AND gate and has a control signal input, the controllable gate being constructed in such a manner that the output value is be fed back to at least one internal input of a switching unit if a predetermined value is present at the control signal input.

7. The electrical diagnostic circuit of claim 5, comprising wherein the switching units of the electrical diagnostic circuit in each case have at least two, particularly series-connected storage units ($D_1$, $D'_1$; $\ldots$; $D_n$, $D'_n$), the output of the last storage unit ($D'_1, \ldots, D'_n$) in each case of each switching unit forming the output of the relevant switching unit.

8. The electrical diagnostic circuit of claim 5, comprising wherein at least one further storage unit, not belonging to a switching unit, is provided which is connected to the output of a switching unit of the electrical diagnostic circuit.

9. The electrical diagnostic circuit of claim 5, comprising wherein the feedback unit has an OR gate, particularly an exclusive OR gate, one input of the controllable gate being connected to the output of the OR gate and the inputs of the OR gate being formed by at least two feedback lines which in each case branch off after at least one switching unit and/or after in each case one storage unit.

10. The electrical diagnostic circuit of claim 5, comprising wherein the feedback unit has a further controllable gate, particularly a controllable AND gate, a controllable OR gate, a controllable NAND gate or a controllable NOR gate, the inputs of the further controllable gate being formed by a further control signal input and by the output of the last switching unit, and the output of the further controllable gate forming the circuit output.

11. The electrical diagnostic circuit of claim 5, comprising wherein at least one further gate, particularly an exclusive OR gate is provided which is in each case located between switching units arranged in series, the output value present at the circuit output being conducted to an input of this further gate.

12. The electrical diagnostic circuit of claim 1, comprising wherein a selection circuit, which is intended for controlling the electrical diagnostic circuit, is provided at the inputs ($E_n$) of the electrical diagnostic circuit.

13. The electrical diagnostic circuit of claim 1, that is integrated monolithically on the integrated circuit to be tested and/or to be diagnosed.

14. A probe card for testing integrated circuits, the probe card having an electrical diagnostic circuit as claimed in one of claim 1.

15. A load board for receiving a probe card for testing integrated circuits and/or with one or more test sockets for testing integrated circuits and/or for connecting a handler to a tester of integrated circuits, the load board having an electrical diagnostic circuit as claimed in claim 1.

16. A tester with measuring sensors, particularly for currents and voltages and with instruments for generating digital signals or datastreams, the tester having an electrical diagnostic circuit as claimed in claim 1.

17. An electrical diagnostic circuit for the testing and/or the diagnostic analysis of an integrated circuit comprising:
   a plurality of external inputs (E.sub.n) for receiving digital values;
   a plurality of essentially similar, series-connected switching units comprising:
   each switching unit is connected to one external input for receiving a test signal of an integrated circuit;
   each switching unit has an internal input for an input signal from a switching unit arranged upstream or downstream,
   the switching units are configured to be controllable such that an input signal present at the internal input of a switching unit, in dependence on a control signal of the switching unit, is forwarded either unchanged to the internal input of the switching unit arranged downstream or to the circuit output and/or are fed back to an internal input of a switching unit arranged upstream, or are combined with the test signal in each case present at the external input and the combination value determined from this combination is forwarded to the internal input of the switching unit in each case arranged downstream or to the circuit output and/or is fed back to the internal input of one of the switching units arranged upstream; and
   a circuit output for outputting an output value comprising wherein the first switching unit has an AND gate and a storage unit and in that all further switching units have one gate each, particularly an exclusive OR gate (XOR-.sub.2-XOR.sub.n), one multiplexer each and one storage unit each.

18. The electrical diagnostic circuit of claim 17, comprising wherein the first external input leads to the first input of the AND gate and a control line leads to the second input of the AND gate, the output of the AND gate leading to the storage unit, the output of which represents the output of the first switching unit, and in that each further external input in each case leads to one input of the in each case associated exclusive OR gate, each internal input of the switching units in each case leading to a first input of the downstream multiplexer and, in parallel, to a second input of the respective exclusive OR gate, each output of an exclusive OR gate in each case leading to a second input of the downstream multiplexer and each output of the multiplexer in each case leading to an input of the downstream storage element, the output of which represents the output of the switching unit.

19. The electrical diagnostic circuit of claim 18, comprising wherein for all switching units except the first switching unit, the internal input is connected to the first input of the multiplexer and to the second input of the exclusive OR gate.

20. The electrical diagnostic circuit of claim 17, comprising wherein the output of the last switching unit is connected to a shift register with linear feedback.

21. The electrical diagnostic circuit of claim 20, comprising wherein the shift register with linear feedback has an exclusive OR gate, a number of series-connected storage elements ($D'_1, \ldots, D'_m$) and at least one feedback line, which branches off after a storage element ($D'_1, \ldots, D'_m$) and which leads/lead to in each case one input of the exclusive OR gate, the first storage element ($D'_1$) being connected to the output of the exclusive OR gate.

22. A method for testing and/or for the diagnostic analysis of an integrated circuit, comprising:
   providing an electrical diagnostic circuit which has n external inputs for receiving test data of n parallel datastreams of an integrated circuit to be tested and/or to be diagnosed and which is capable of generating signatures from the received test data, the test data present at the n external inputs selectively being included or not included in the generation of the signatures,
   connecting the electrical diagnostic circuit to the integrated circuit to be tested and/or to be diagnosed, in such a manner that the n inputs of the electrical diagnostic circuit are present at the n outputs of the integrated circuit;
   controlling the switching units of the electrical diagnostic circuit in such a manner that the test data in each case present at the external inputs are included in the generation of the signatures;
   detecting and processing the test data of the integrated circuit to be tested and/or to be diagnosed to form at least one signature in one or in more successive test runs through the electrical diagnostic circuit;
   checking the signature for correctness by comparing the signatures determined in the test with the correct signature stored in the tester or determined by the tester;
   if at least one errored signature has been determined, carrying out the following processes:
   performing k successive test runs, wherein in each case only those data, present at the external input, of the n datastreams in the jth run are included in the compacting in the electrical diagnostic circuit if the binary coefficient $a_{i,j}$ of the equations for determining the control points of a linear separable error-correcting code with n information points $u_1, \ldots, u_n$ and with k control points $v_1, \ldots, v_k$ is equal to one, the k control points $v_1, \ldots, v_k$ being determined by the k binary equations $$v_1 = a_{1,1}u_1 \oplus \ldots \oplus a_{1,n}u_n$$
$$\vdots$$
$$v_1 = a_{k,1}u_1 \oplus \ldots \oplus a_{k,n}u_n$$

from the n information points;
   determining the errored elements in the n datastreams, particularly the errored scan cells of the diagnosed integrated circuit from the deviations of observed output signatures $y^b$ output by the electrical diagnostic circuit at its output in the k test runs $$[y_1^b, y_2^b, y_3^b, \ldots]$$

from the corresponding correct output signatures $y^k$ $$[y_1^k, y_2^k, y_3^k, \ldots]$$

where n, k, j and y are integers greater or equal to 1 (n, k, j, y≧1).

23. The method of claim 22, comprising wherein the datastreams are data which are shifted out of the scan paths of an integrated circuit.

24. The method of claim 22, comprising wherein the electrical diagnostic circuit is an electrical diagnostic circuit as claimed in claim 1.

25. The method of claim 22, comprising wherein the electrical diagnostic circuit is constructed on a probe card as claimed in claim 14, on a load board as claimed in claim 15 or on a tester as claimed in claim 16.

26. The method of claim 22, comprising wherein the switching units are activated by means of a control signal in such a manner that the input signals present at the internal inputs of the switching units are combined with the test data in each case present at the external inputs and that the combination values in each case determined from these combinations are forwarded to the internal inputs of the switching units in each case arranged downstream.

27. The method of claim 22, comprising wherein all control signals $c_{i,j}$, $1 \leq i \leq k$, $1 \leq j \leq n$ of the multiplexers ($MUX_1, \ldots, MUX_n$) are selected to be one.

28. The method of claim 22, comprising wherein if the electrical diagnostic circuit has a feedback unit, it is activated in such a manner that it does not feed back.

29. The method of claim 22, comprising wherein if the electrical diagnostic circuit has a feedback unit, it is activated in such a mariner that it does not feed back.

30. The method of claim 22, comprising wherein performing successive test runs is carried out as follows:

carrying out k successive test runs, wherein a control point is determined with each run in accordance with the following rule from the information points until all control points ($v_k$) have been determined, $$v_1 = a_{1,1} u_1 \oplus \ldots \oplus a_{1,n} u_n$$
$$\vdots$$
$$v_k = a_{k,1} u_1 \oplus \ldots \oplus a_{k,n} u_n$$

wherein the coefficients $a_{i,j}$ with $1 \leq i \leq k$, $1 \leq j \leq n$, assume the values zero or one, the switching units of the electrical diagnostic circuit being controlled in such a manner that the test data present at the jth external input in the ith run are only subjected to a combination in the switching units if the control signal $c_{i,j}$, with $1 \leq i \leq k$, $1 \leq j \leq n$, assumes the value one, whereby the control signal $c_{i,j}$ assumes the value zero if the associated coefficient $a_{i,j}$ assumes the value zero or if an indeterminate value in the datastream is to be blanked out.

31. The method of claim 22, comprising wherein the value of the control signal present at the first input of the AND gate assumes the value zero if an indeterminate value is present at the output of the upstream storage element $D_n$, and thus at its second input.

32. The method of claim 22, comprising wherein performing successive test runs is carried out as follows: carrying out k successive test runs by the switching units of the electrical diagnostic circuit being controlled in accordance with the binary coefficients $a_{i,j}$ of the equations for determining the control points $v_1, \ldots v_k$ of a linear separable error-correcting code with n information points $u_1, \ldots, u_n$ and with k control points $v_1, \ldots, v_k$, in such a manner that the test data (u, t, s, r) present at the jth external input ($E_j$) in the ith run are only subjected to a combination in the switching units of the electrical diagnostic circuit when the binary control signal $c_{i,j}$, with $1 \leq i \leq k$, $1 \leq j \leq n$, assumes the value one, whereby the control signal $c_{i,j}$ assumes the value zero when the associated coefficient $a_{i,j}$ in the linear equations for determining the k control points of the error-detecting code assumes the value zero or when an indeterminate value in the datastream is to be blanked out, the k control points $v_1, \ldots, v_k$ being determining form the k binary equations $$v_1 = a_{1,1} u_1 \oplus \ldots \oplus a_{1,n} u_n$$
$$\vdots$$
$$v_k = a_{k,1} u_1 \oplus \ldots \oplus a_{k,n} u_n$$

from the n information points.

33. The method of claim 32, comprising wherein the multiplexers of the switching units are controlled by the control signals.

34. The method of claim 32, comprising wherein a selection circuit which controls the input into the electrical diagnostic circuit is provided between the outputs ($A_n$) of the integrated circuit and the inputs ($E_n$) of the electrical diagnostic circuit.

35. Using the method of claim 22 for testing and/or for the diagnostic analysis of printed board assemblies or of circuit boards.

36. A tangible storage medium comprises a computer program for testing an integrated circuit comprising:

providing an electrical diagnostic circuit which has n external inputs for receiving test data of n parallel datastreams of an integrated circuit to be tested and/or to be diagnosed and which is capable of generating signatures from the received test data, the test data present at the n external inputs selectively being included or not included in the generation of the signatures, connecting the electrical diagnostic circuit to the integrated circuit to be tested and/or to be diagnosed, in such a manner that the n inputs of the electrical diagnostic circuit are present at the n outputs of the integrated circuit;

controlling the switching units of the electrical diagnostic circuit in such a manner that the test data in each case present at the external inputs are included in the generation of the signatures;

detecting and processing the test data of the integrated circuit to be tested and/or to be diagnosed to form at least one signature in one or in more successive test runs through the electrical diagnostic circuit;

checking the signature for correctness by comparing the signatures determined in the test with the correct signature stored in the tester or determined by the tester;

if at least one errored signature has been determined, carrying out the following processes:

performing k successive test runs, wherein in each case only those data, present at the external input, of the n datastreams in the jth run are included in the compacting in the electrical diagnostic circuit if the binary coefficient $a_{i,j}$ of the equations for determining the control points of a linear separable error-correcting code with n information points $u_1, \ldots, u_n$ and with k control points $v_1, \ldots, v_k$ is equal to one, the k control points $v_1, \ldots, v_k$ being determined by the k binary equations $$v_1 = a_{1,1} u_1 \oplus \ldots \oplus a_{1,n} u_n$$
$$\vdots$$
$$v_1 = a_{k,1} u_1 \oplus \ldots \oplus a_{k,n} u_n$$

from the n information points;

determining the errored elements in the n datastreams, particularly the errored scan cells of the diagnosed integrated circuit from the deviations of observed output signatures $y^b$ output by the electrical diagnostic circuit at its output in the k test runs $$[y_1^b, y_2^b, y_3^b, \ldots]$$

from the corresponding correct output signatures $y^k$ $$[y_1^k, y_2^k, y_3^k, \ldots].$$

where n, k, j and y are integers greater or equal to 1 (n, k, j, y≧1).

37. The computer program of claim 36, which is contained on a storage medium.

38. The computer program of claim 36, which is transmitted on an electrical carrier signal.

39. A data carrier comprising a computer program as claimed in claim 36.

40. A method in which a computer program as claimed in claim 36 is downloaded from an electronic data network.

* * * * *